(12) United States Patent
Utsumi et al.

(10) Patent No.: US 8,751,992 B2
(45) Date of Patent: Jun. 10, 2014

(54) POWER SUPPLY WIRING STRUCTURE

(75) Inventors: Tetsuaki Utsumi, Yokohama (JP); Naoyuki Kawabe, Yokosuka (JP); Keiji Omotani, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/420,945

(22) Filed: Mar. 15, 2012

(65) Prior Publication Data

US 2013/0063203 A1 Mar. 14, 2013

(30) Foreign Application Priority Data

Sep. 8, 2011 (JP) ................................ 2011-196200

(51) Int. Cl.
*G06F 17/50* (2006.01)
*H01L 23/52* (2006.01)

(52) U.S. Cl.
USPC ........... 716/120; 716/109; 716/132; 716/133; 716/138; 257/207; 257/758; 257/774

(58) Field of Classification Search
USPC .......... 716/109, 120, 132, 133, 138; 257/207, 257/758, 774
See application file for complete search history.

(56) References Cited

U.S. PATENT DOCUMENTS

| | | | |
|---|---|---|---|
| 5,633,479 A * | 5/1997 | Hirano | ........................... 174/255 |
| 5,789,791 A | 8/1998 | Bergemont | |
| 5,847,421 A | 12/1998 | Yamaguchi | |
| 6,057,225 A | 5/2000 | Yokota | |
| 6,247,162 B1 | 6/2001 | Fujine et al. | |
| 6,271,548 B1 | 8/2001 | Umemoto et al. | |
| 6,274,895 B1 | 8/2001 | Fujii et al. | |
| 6,396,150 B2 | 5/2002 | Kohno | |
| 6,611,943 B2 * | 8/2003 | Shibata et al. | ................. 716/102 |
| 6,795,956 B2 | 9/2004 | Hokari | |
| 7,076,756 B2 | 7/2006 | Ichimiya | |
| 7,426,707 B2 | 9/2008 | Ichimiya | |
| 7,500,211 B2 * | 3/2009 | Komaki | ......................... 716/120 |
| 7,501,689 B2 * | 3/2009 | Yoshida et al. | ................ 257/502 |
| 7,505,285 B2 | 3/2009 | Osaka | |
| 7,523,436 B2 * | 4/2009 | Mizuno et al. | ................... 716/50 |

(Continued)

FOREIGN PATENT DOCUMENTS

| | | | |
|---|---|---|---|
| JP | 2004-158532 A | 6/2004 | |
| JP | 2005-322785 | 11/2005 | |

(Continued)

OTHER PUBLICATIONS

U.S. Appl. No. 13/233,996, filed Sep. 15, 2011, Utsumi.

(Continued)

*Primary Examiner* — Helen Rossoshek
(74) *Attorney, Agent, or Firm* — Knobbe, Martens, Olson & Bear LLP

(57) ABSTRACT

According to an embodiment, a semiconductor integrated circuit including first and second lower-layer power supply wires extending in a first direction and first and second upper-layer power supply wires extending in a second direction is provided. First and second connection wires between the upper-layer power supply wires and the lower-layer power supply wires are arranged in a same line along the second direction. First and second position converting wires extending from the connection wires are arranged between the first and second connection wires. First and second upper-side vias provided on the position converting wires are arranged in a same line along the first direction.

7 Claims, 11 Drawing Sheets

(56) References Cited

U.S. PATENT DOCUMENTS

| | | | |
|---|---|---|---|
| 7,692,942 B2 | 4/2010 | Oosaka | |
| 7,694,260 B2* | 4/2010 | Tamiya | 716/126 |
| 7,719,115 B2* | 5/2010 | Seta | 257/758 |
| 7,797,660 B2 | 9/2010 | Kujubu | |
| 7,800,136 B2* | 9/2010 | Shiga | 257/207 |
| 7,956,647 B2 | 6/2011 | Katoh | |
| 7,989,849 B2* | 8/2011 | Sherlekar et al. | 257/207 |
| 8,171,441 B2 | 5/2012 | McElvain et al. | |
| 8,193,608 B2 | 6/2012 | Yabu et al. | |
| 8,362,616 B2 | 1/2013 | Yasumori et al. | |
| 8,413,100 B2* | 4/2013 | Chuang | 716/132 |
| 2001/0054721 A1 | 12/2001 | Takayama | |
| 2002/0074660 A1 | 6/2002 | Fukasawa | |
| 2002/0145444 A1* | 10/2002 | Mizuno et al. | 326/41 |
| 2004/0065961 A1 | 4/2004 | Funakoshi et al. | |
| 2004/0205685 A1 | 10/2004 | Takeda | |
| 2005/0050502 A1* | 3/2005 | Kurihara et al. | 716/10 |
| 2006/0214280 A1 | 9/2006 | Mizuno et al. | |
| 2007/0033562 A1* | 2/2007 | Correale et al. | 716/10 |
| 2007/0228419 A1* | 10/2007 | Komaki | 257/202 |
| 2008/0048318 A1 | 2/2008 | Sakurabayashi | |
| 2008/0054307 A1* | 3/2008 | Shimizu | 257/207 |
| 2008/0246160 A1 | 10/2008 | Ozoe et al. | |
| 2009/0031267 A1 | 1/2009 | Ueki | |
| 2009/0064066 A1* | 3/2009 | Kurihara et al. | 716/5 |
| 2009/0166894 A1 | 7/2009 | Azumai | |
| 2009/0321791 A1* | 12/2009 | Wagner | 257/207 |
| 2010/0122230 A1* | 5/2010 | Qiu | 716/12 |
| 2010/0177127 A1 | 7/2010 | Akiyama et al. | |
| 2010/0237508 A1* | 9/2010 | Utsumi | 257/774 |
| 2011/0012960 A1 | 1/2011 | Sakuma et al. | |
| 2011/0037754 A1 | 2/2011 | Kobashi et al. | |
| 2011/0254066 A1 | 10/2011 | Miura | |
| 2011/0294263 A1 | 12/2011 | Ogawa et al. | |
| 2012/0235241 A1* | 9/2012 | Barrow | 257/368 |
| 2013/0082373 A1* | 4/2013 | Duetemeyer et al. | 257/690 |

FOREIGN PATENT DOCUMENTS

| | | |
|---|---|---|
| JP | 2005-322785 A | 11/2005 |
| JP | 2006-202824 A | 8/2006 |
| JP | 2006-244080 A | 9/2006 |
| JP | 2008-066371 | 3/2008 |
| JP | 2008-078342 A | 4/2008 |
| JP | 2008-310527 A | 12/2008 |
| JP | 2010-219332 | 9/2010 |
| JP | 2011-014637 A | 1/2011 |

OTHER PUBLICATIONS

Office Action mailed Jan. 21, 2014 for corresponding Japanese Patent Application 2011-196200, in 5 pages.

* cited by examiner

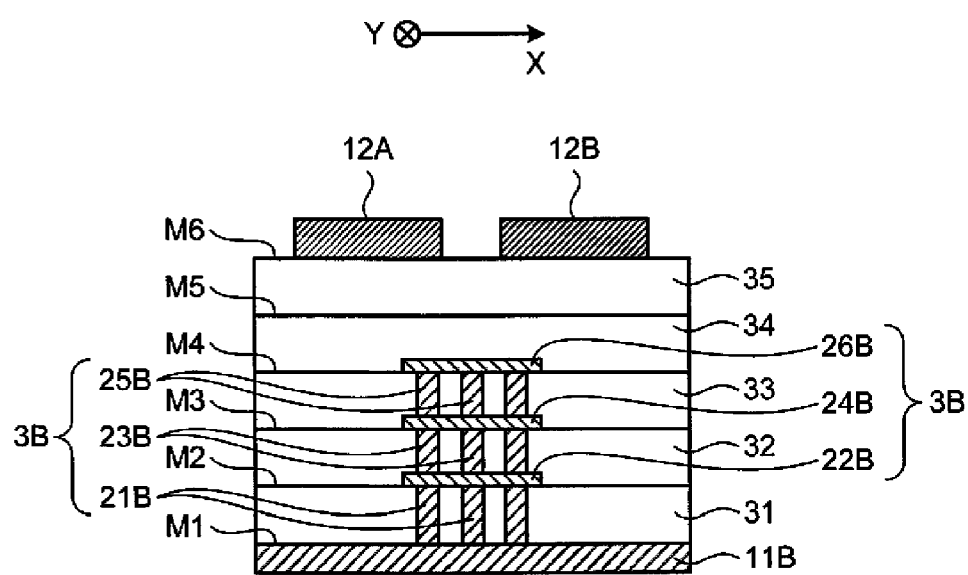

POWER SUPPLY WIRING STRUCTURE

CROSS-REFERENCE TO RELATED APPLICATIONS

This application is based upon and claims the benefit of priority from Japanese Patent Application No. 2011-196200, filed on Sep. 8, 2011; the entire contents of which are incorporated herein by reference.

FIELD

Embodiments described herein relate generally to a semiconductor integrated circuit, a design method of the semiconductor integrated circuit, and a design apparatus of the semiconductor integrated circuit.

BACKGROUND

A semiconductor integrated circuit in which a power supply wire is provided in wiring layers separated in the vertical direction by sandwiching an interlayer dielectric therebetween is known. The power supply wire provided in an upper wiring layer and the power supply wire provided in a lower wiring layer extend in directions that are mutually different by 90 degrees. A method of connecting the upper-layer power supply wire and the lower-layer power supply wire by providing a power supply stack via in a region between the wiring layers separated in the vertical direction may be used. The power supply stack via is configured by including an intermediate wire formed in an intermediate wiring layer and vias provided above and below the intermediate wire.

In such a semiconductor integrated circuit, it is required to design the shape of the power supply stack via in such a way that a signal wire formed in the intermediate wiring layer separately from the intermediate wire can be wired without a detour.

BRIEF DESCRIPTION OF THE DRAWINGS

FIG. 2C is an arrow sectional view along a Q-Q line shown in FIG. 2A;

DETAILED DESCRIPTION

In general, according to one embodiment, a semiconductor integrated circuit including a first lower-layer power supply wire and a second lower-layer power supply wire extended in a first direction in a lower wiring layer, a first upper-layer power supply wire and a second upper-layer power supply wire extended in a second direction substantially perpendicular to the first direction in a plane view in an upper wiring layer, a first connection portion connecting the first upper-layer power supply wire and the first lower-layer power supply wire, and a second connection portion connecting the second upper-layer power supply wire and the second lower-layer power supply wire is provided. The first connection portion includes a first connection wire formed in a predetermined wiring layer between the lower wiring layer and the upper wiring layer and positioned above the first lower-layer power supply wire, a first lower-side via provided below the first connection wire and connected to the first lower-layer power supply wire, a first position converting wire formed in the predetermined wiring layer and extending from the first connection wire, and a first upper-side via provided above the first position converting wire and connected to the first upper-layer power supply wire. The second connection portion includes a second connection wire formed in the predetermined wiring layer and positioned above the second lower-layer power supply wire, a second lower-side via provided below the second connection wire and connected to the second lower-layer power supply wire, a second position converting wire formed in the predetermined wiring layer, extending from the second connection wire, and provided closer to the second upper-layer power supply wire than the first connection wire in the plane view, and a second upper-side via provided above the second position converting wire and connected to the second upper-layer power supply wire. The first connection wire and the second connection wire are arranged in a same line along the second direction in the plane view. The first position converting wire extends toward the second connection wire and is formed in a region created by elongating the first connection wire along the second direction. The second position converting wire extends toward the first connection wire and is formed in a region created by elongating the second connection wire along the second direction. The first upper-side via and the second upper-side via are arranged in positions in a same line along the first direction.

Exemplary embodiments of a semiconductor integrated circuit, a design method of the semiconductor integrated circuit, and a design apparatus of the semiconductor integrated circuit will be explained below in detail with reference to the accompanying drawings. The present invention is not limited to the following embodiments.

Figure 1:
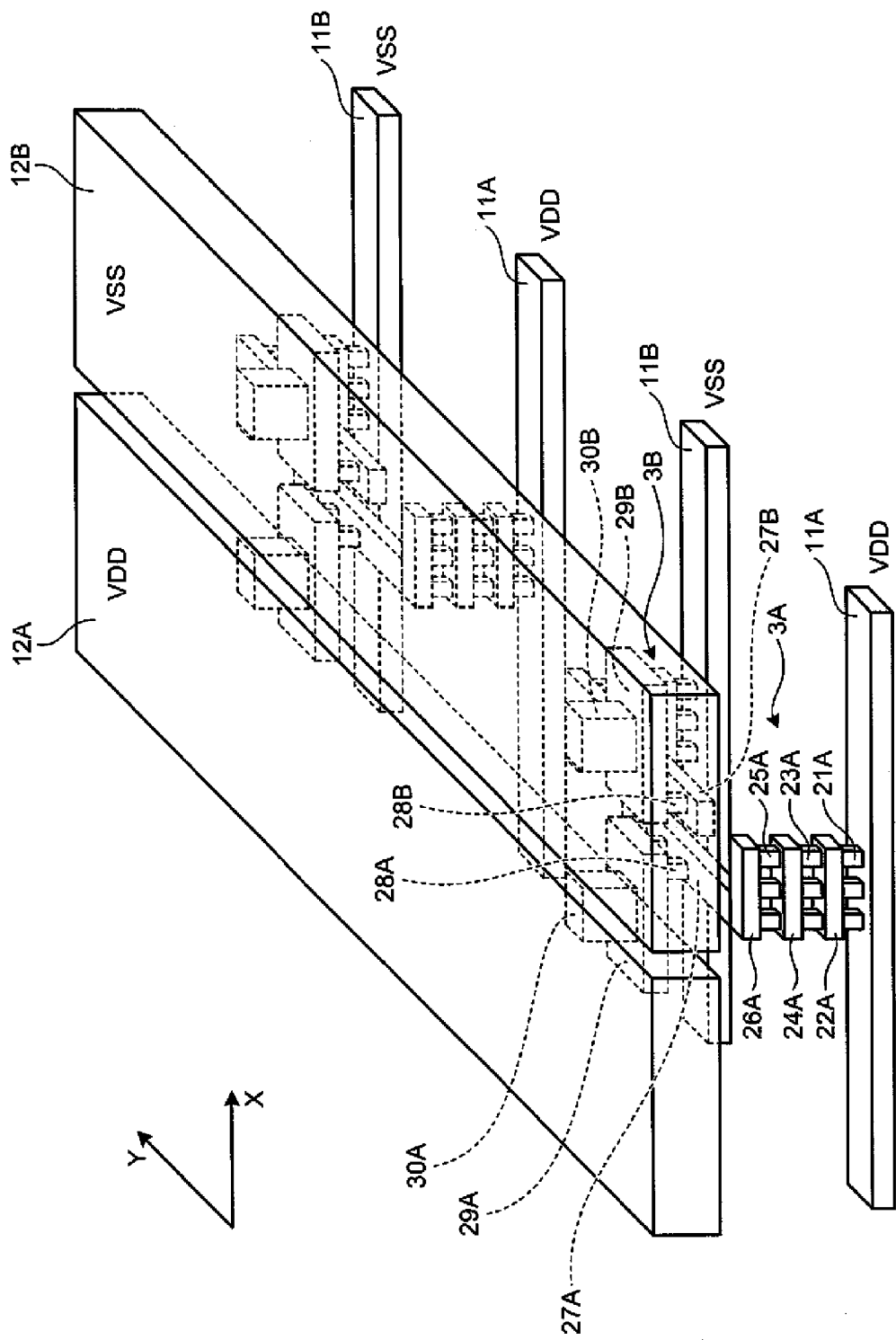
FIG. 1 is a perspective view schematically showing an example of a power supply wiring structure in a semiconductor integrated circuit according to a first embodiment.
Figure 2A:
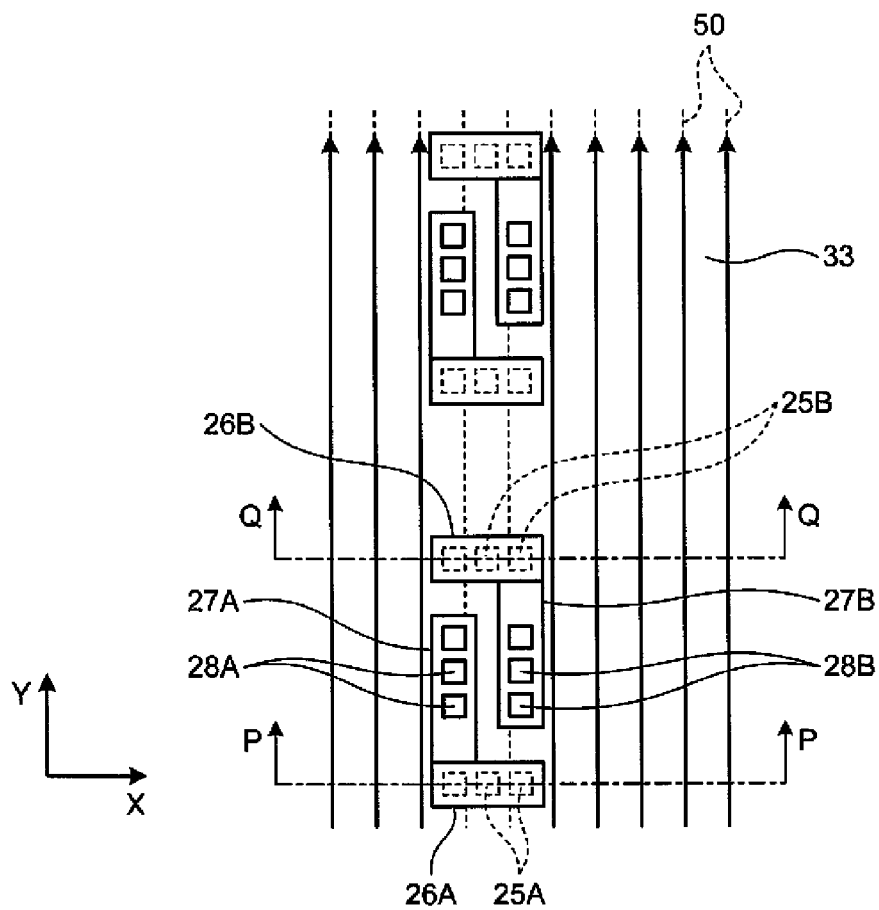
FIG. 2A is a plan view showing an intermediate wiring layer.
Figure 2B:
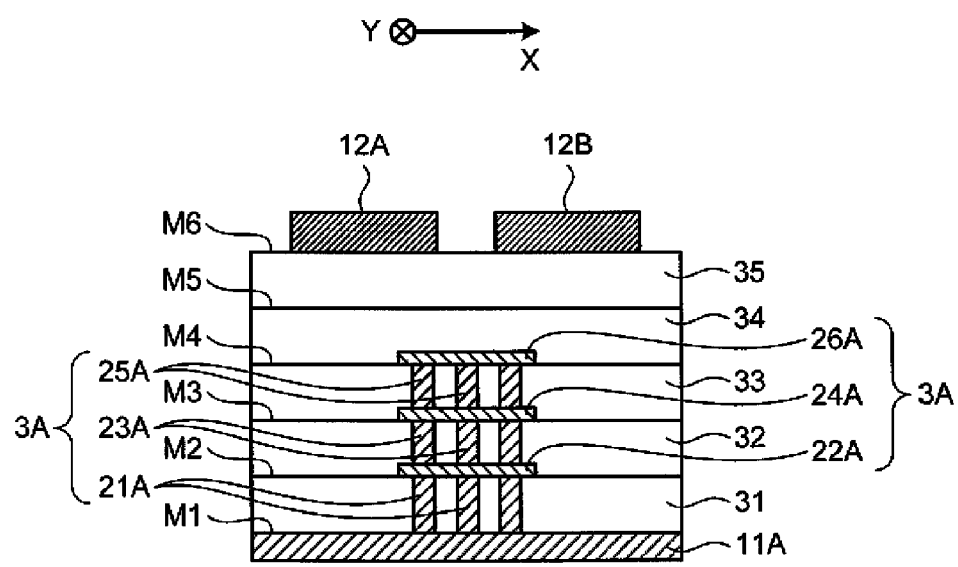
FIG. 2B is an arrow sectional view along a P-P line shown in FIG. 2A.
Figure 3A:
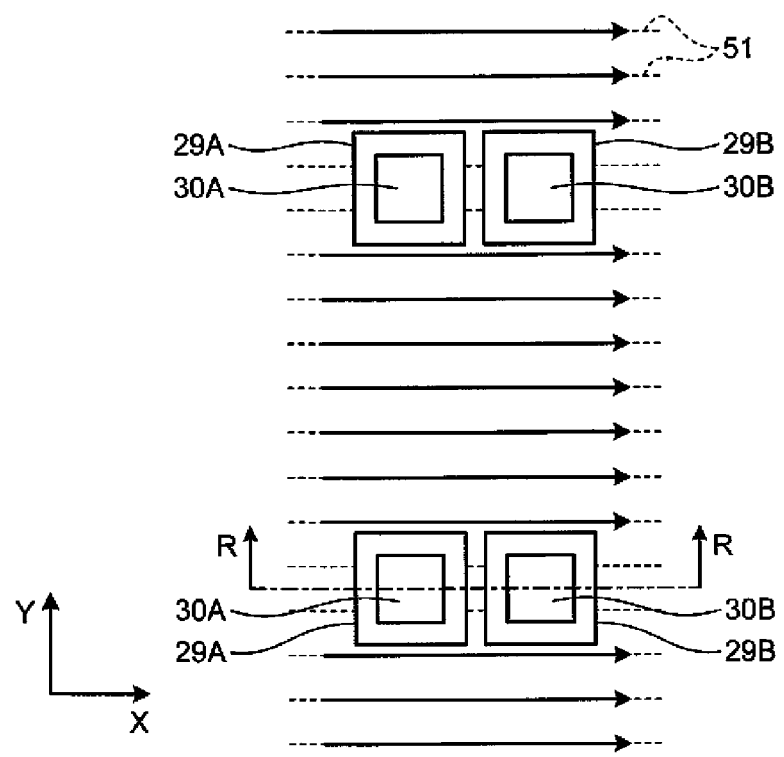
FIG. 3A is a plan view showing the intermediate wiring layer.
Figure 3B:
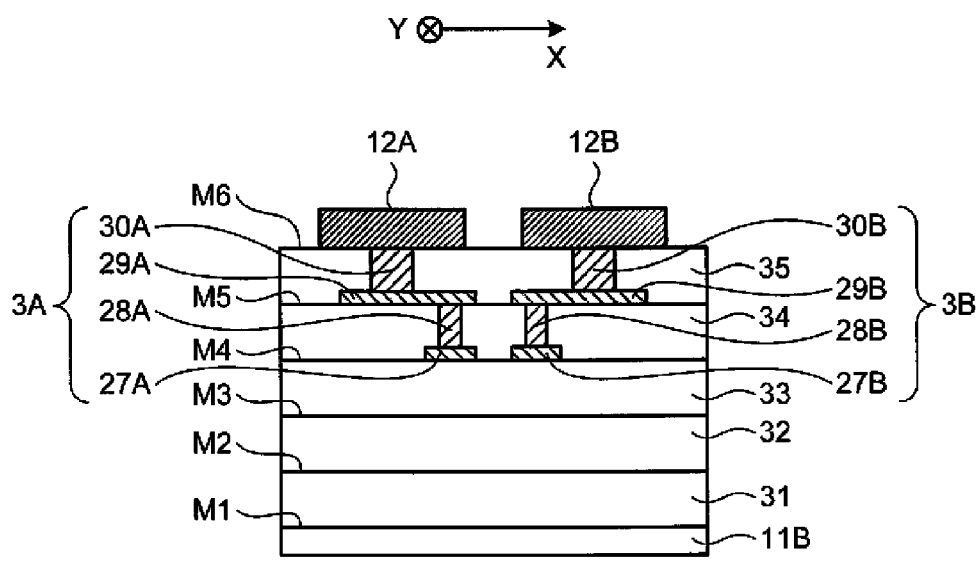
FIG. 3B is an arrow sectional view along an R-R line shown in FIG. 3A.

FIG. 1 is a perspective view schematically showing an example of a power supply wiring structure in a semiconductor integrated circuit according to the first embodiment. FIG. 2A is a plan view of a first intermediate wiring layer. FIG. 2B is an arrow sectional view along a P-P line shown in FIG. 2A. FIG. 2C is an arrow sectional view along a Q-Q line shown in FIG. 2A. FIG. 3A is a plan view showing a second intermediate wiring layer. FIG. 3B is an arrow sectional view along an R-R line shown in FIG. 3A.

The power supply wiring structure in the semiconductor integrated circuit includes a lower wiring layer M1 in which lower-layer power supply wires (a first lower-layer power supply wire 11A and a second lower-layer power supply wire 11B) are formed and an upper wiring layer M6 in which upper-layer power supply wires (a first upper-layer power supply wire 12A and a second upper-layer power supply wire 12B) are formed.

The lower-layer power supply wires (the first lower-layer power supply wire 11A and the second lower-layer power supply wire 11B) are formed so as to extend along the first direction. The first direction is defined as an X direction. The upper-layer power supply wires (the first upper-layer power supply wire 12A and the second upper-layer power supply wire 12B) are formed so as to extend along the second direction substantially perpendicular to the first direction in the plane view. The second direction is defined as a Y direction.

A plurality of the first upper-layer power supply wires 12A and a plurality of the second upper-layer power supply wires 12B are placed and formed along the Y direction. In FIG. 1, only one set of the first upper-layer power supply wire 12A and the second upper-layer power supply wire 12B is shown and other wires are omitted. A plurality of the first lower-layer power supply wires 11A and a plurality of the second lower-layer power supply wires 11B are placed and formed along the X direction. In FIG. 1, only two sets of the first lower-layer power supply wires 11A and the second lower-layer power supply wires 11B are shown, but more sets may be placed and formed along the X direction. The first upper-layer power supply wire 12A and the second upper-layer power supply wire 12B are not limited to the arrangement in which the first upper-layer power supply wire 12A and the second upper-layer power supply wire 12B are placed alternately. For example, the plurality of the second upper-layer power supply wires 12B may be placed between the first upper-layer power supply wires 12A or the plurality of the first upper-layer power supply wires 12A may be placed between the second upper-layer power supply wires 12B. Also, the first lower-layer power supply wire 11A and the second lower-layer power supply wire 11B are not limited to the arrangement shown in FIG. 1 in which the lower-layer power supply wires are placed alternately. For example, the plurality of the second lower-layer power supply wires 11B may be placed between the first lower-layer power supply wires 11A or the plurality of the first lower-layer power supply wires 11A may be placed between the second lower-layer power supply wires 11B.

In the wiring structure, the first lower-layer power supply wire 11A and the first upper-layer power supply wire 12A are power supply wires of the same type, for example, VDD wires used to supply a power supply potential (VDD). Also, the second lower-layer power supply wire 11B and the second upper-layer power supply wire 12B are power supply wires of the same type, for example, VSS wires used to supply an earth potential (VSS).

Between the lower wiring layer M1 and the upper wiring layer M6 is a multilayer structure in which interlayer dielectrics 31 to 35 are stacked. A first power supply stack via (first connection portion) 3A to connect the first lower-layer power supply wire 11A and the first upper-layer power supply wire 12A and a second power supply stack via (second connection portion) 3B to connect the second lower-layer power supply wire 11B and the second upper-layer power supply wire 12B are provided between the lower wiring layer M1 and the upper wiring layer M6.

The first power supply stack via 3A includes vias 21A, 23A, 25A, 28A, 30A and intermediate wires 22A, 24A, 26A, 27A, 29A. The vias 21A, 23A, 25A, 28A, 30A are provided by cutting through the interlayer dielectrics 31 to 35. The intermediate wires 22A, 24A, 26A, 27A, 29A are formed in wiring layers M2 to M5 between the interlayer dielectrics 31 to 35. In the description that follows, the vias 21A, 23A, 25A provided below the intermediate wire 26A will be called first lower vias. The vias 28A, 30A provided above the intermediate wire 27A will be called first upper vias.

The second power supply stack via 3B includes vias 21B, 23B, 25B, 28B, 30B and intermediate wires 22B, 24B, 26B, 27B, 29B. The vias 21B, 23B, 25B, 28B, 30B are provided by cutting through the interlayer dielectrics 31 to 35. The intermediate wires 22B, 24B, 26B, 27B, 29B are formed in the wiring layers M2 to M5 between the interlayer dielectrics 31 to 35. In the description that follows, the vias 21B, 23B, 25B provided below the intermediate wire 26B will be called second lower vias. The vias 28B, 30B provided above the intermediate wire 27B will be called second upper vias.

The intermediate wires 22A, 24A, 26A are formed so as to be positioned above the first lower-layer power supply wire 11A. The vias 21A, 23A, 25A are provided below the intermediate wires 22A, 24A, 26A and connected to lower intermediate wires and the first lower-layer power supply wire 11A.

The intermediate wires 22B, 24B, 26B are formed so as to be positioned above the second lower-layer power supply wire 11B. The vias 21B, 23B, 25B are provided below the intermediate wires 22B, 24B, 26B and connected to lower intermediate wires and the second lower-layer power supply wire 11B.

The intermediate wire 27A (first position converting wire) is formed so as to extend toward the intermediate wire 26B (second connection wire) from the intermediate wire 26A (first connection wire) formed in the highest layer among the intermediate wires 22A, 24A, 26A formed so as to be positioned above the first lower-layer power supply wire 11A. The intermediate wire 27A is formed on the side closer to the first upper-layer power supply wire 12A of the intermediate wire 26A in the plane view.

The wiring layer M4 in which the intermediate wire 26A and the intermediate wire 27A are formed is a wiring layer where the via 25A and the via 28A shifted in the plane view are connected and will be called a via connecting wiring layer (predetermined wiring layer) in the description that follows.

The intermediate wire 27B (second position converting wire) is formed so as to extend toward the intermediate wire 26A from the intermediate wire 26B formed in the highest layer among the intermediate wires 22B, 24B, 26B formed so as to be positioned above the second lower-layer power supply wire 11B. The intermediate wire 27B is formed on the side closer to the second upper-layer power supply wire 12B of the intermediate wire 26B in the plane view.

The intermediate wires 22A, 24A, 26A formed so as to be positioned above the first lower-layer power supply wire 11A and the intermediate wires 22B, 24B, 26B formed so as to be positioned above the second lower-layer power supply wire 11B are arranged in the same line along the Y direction in the plane view.

Figure 4:
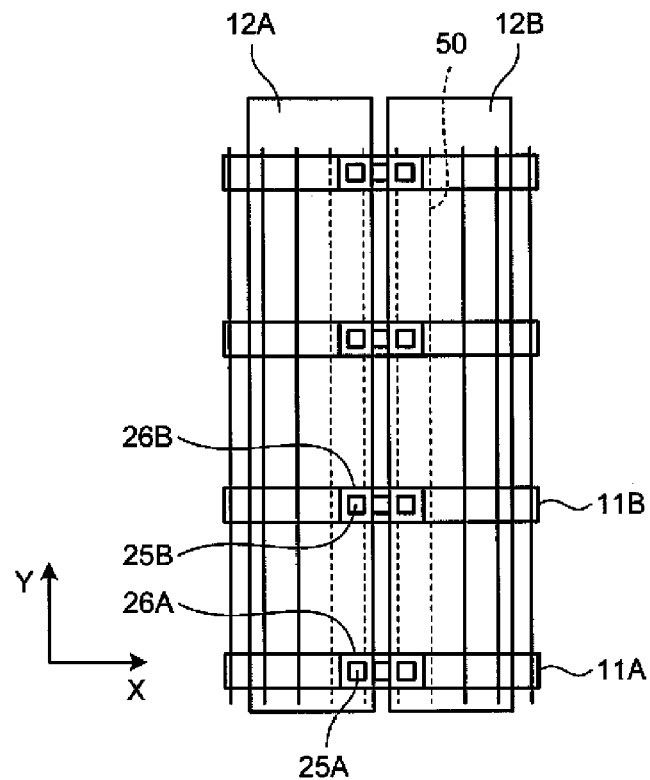
FIG. 4 is a plan view showing a spatial relationship among intermediate wires, lower-layer power supply wires, and upper-layer power supply wires.
Figure 5:
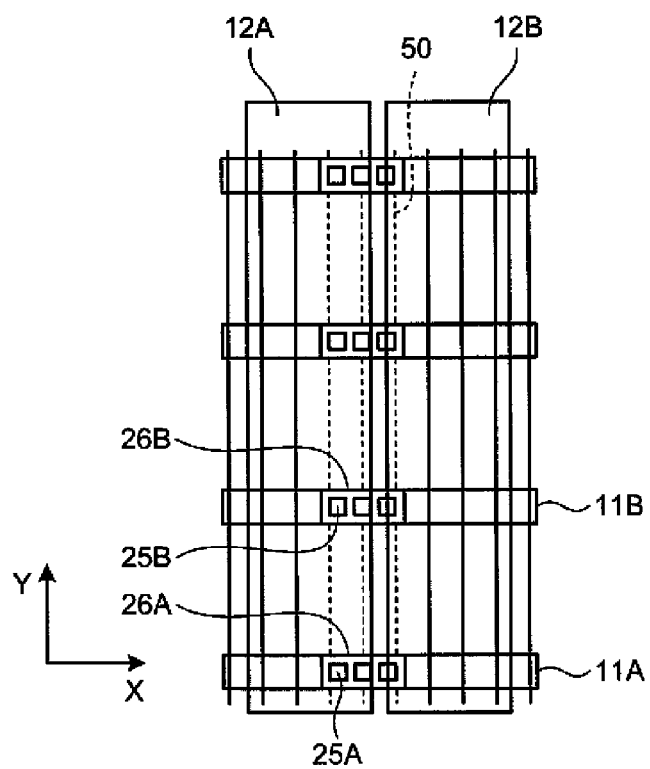
FIG. 5 is a plan view showing another example of the spatial relationship among the intermediate wires, the lower-layer power supply wires, and the upper-layer power supply wires.

FIG. 4 is a plan view showing the spatial relationship among the intermediate wire 22A and the like, the lower-layer power supply wires 11A, 11B, and the upper-layer power supply wires 12A, 12B. FIG. 5 is a plan view showing another example of the spatial relationship among the intermediate wire 22A and the like, the lower-layer power supply wires 11A, 11B, and the upper-layer power supply wires 12A, 12B.

As shown in FIG. 4, the intermediate wires 22A, 24A, 26A and the intermediate wires 22B, 24B, 26B may be placed and arranged in the same line in the intermediate position between the first upper-layer power supply wire 12A and the second upper-layer power supply wire 12B in the plane view. Alternatively, as shown in FIG. 5, the intermediate wires 22A, 24A, 26A and the intermediate wires 22B, 24B, 26B may be placed and arranged in the same line in a position closer to the first upper-layer power supply wire 12A side from the intermediate position between the first upper-layer power supply wire 12A and the second upper-layer power supply wire 12B in the plane view. Though an illustration is omitted, the intermediate wires 22A, 24A, 26A and the intermediate wires 22B, 24B, 26B may also be placed and arranged in the same line in a position closer to the second upper-layer power supply wire 12B side from the intermediate position between the first upper-layer power supply wire 12A and the second upper-layer power supply wire 12B in the plane view.

The intermediate wire 27A as the first position converting wire is formed in a region created by elongating the intermediate wires 22A, 24A, 26A along the Y direction in the plane view. The intermediate wire 27B as the second position converting wire is formed in a region created by elongating the intermediate wires 22B, 24B, 26B along the Y direction in the plane view.

The intermediate wire 27A as the first position converting wire is arranged together with the intermediate wire 27B as the second position converting wire in the same line along the X direction in the plane view (see FIGS. 2, 4, and 5). With the above configuration, the intermediate wire 26A as the first connection wire and the intermediate wire 27A as the first position converting wire exhibits an L shape as a whole in the plane view. Also, the intermediate wire 26B as the second connection wire and the intermediate wire 27B as the second position converting wire exhibits an L shape as a whole in the plane view.

As shown in FIG. 3B, the intermediate wire 29A is formed in an upper layer (wiring layer M5) of the intermediate wire 27A as the first position converting wire. The intermediate wire 27A and the intermediate wire 29A are connected by the via (first upper via) 28A provided on the upper side of the intermediate wire 27A. The intermediate wire 29A and the first upper-layer power supply wire 12A are connected by the via 30A.

The intermediate wire 29B is formed in the upper layer (wiring layer M5) of the intermediate wire 27B as the second position converting wire. The intermediate wire 27B and the intermediate wire 29B are connected by the via (second upper via) 28B provided on the upper side of the intermediate wire 27B. The intermediate wire 29B and the second upper-layer power supply wire 12B are connected by the via 30B.

With the intermediate wire 29A and the intermediate wire 29B arranged above the intermediate wires 27A, 27B as position converting wires, the intermediate wire 29A and the intermediate wire 29B are arranged between the first lower-layer power supply wire 11A and the second lower-layer power supply wire 11B in the plane view. The intermediate wire 29A and the intermediate wire 29B are also arranged in the same line along the X direction in the plane view.

Figure 6:
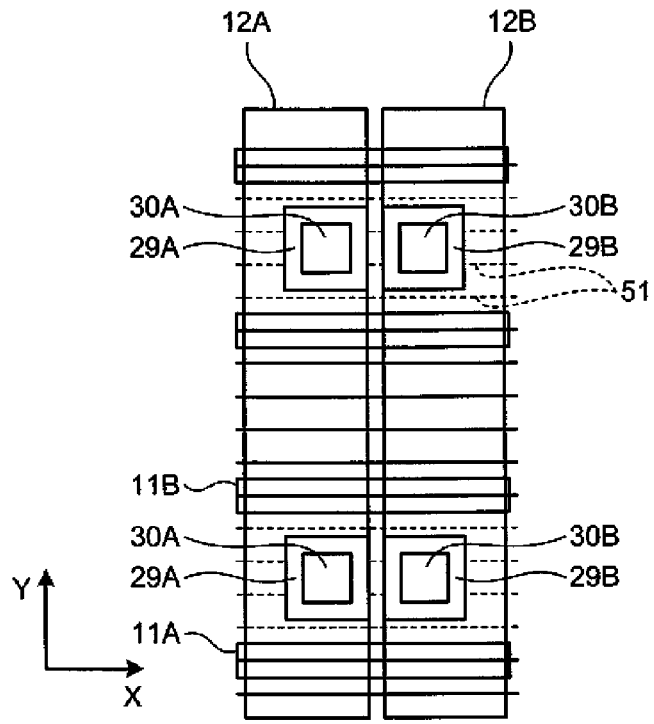
FIG. 6 is a plan view showing the spatial relationship among the intermediate wires, the lower-layer power supply wires, and the upper-layer power supply wires.
Figure 7:
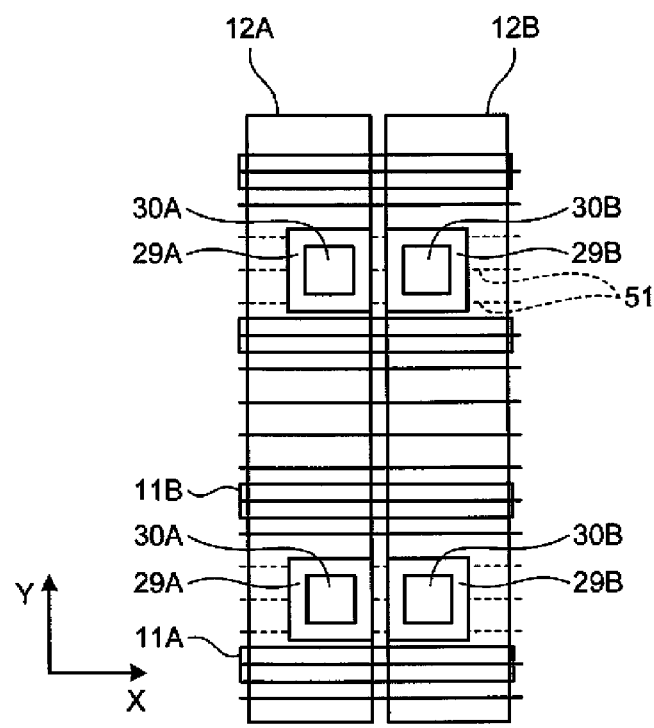
FIG. 7 is a plan view showing another example of the spatial relationship among the intermediate wires, the lower-layer power supply wires, and the upper-layer power supply wires.

FIG. 6 is a plan view showing the spatial relationship among the intermediate wires 29A, 29B, the lower-layer power supply wires 11A, 11B, and the upper-layer power supply wires 12A, 12B. FIG. 7 is a plan view showing another example of the spatial relationship among the intermediate wires 29A, 29B, the lower-layer power supply wires 11A, 11B, and the upper-layer power supply wires 12A, 12B.

As shown in FIG. 6, the intermediate wire 29A and the intermediate wire 29B may be placed and arranged in the same line in an intermediate position between the first lower-layer power supply wire 11A and the second lower-layer power supply wire 11B. Alternatively, as shown in FIG. 7, the intermediate wire 29A and the intermediate wire 29B may be placed and arranged in the same line in a position closer to the first lower-layer power supply wire 11A side from the intermediate position between the first lower-layer power supply wire 11A and the second lower-layer power supply wire 11B in the plane view. Though an illustration is omitted, the intermediate wire 29A and the intermediate wire 29B may be placed and arranged in the same line in a position closer to the second lower-layer power supply wire 11B side from the intermediate position between the first lower-layer power supply wire 11A and the second lower-layer power supply wire 11B in the plane view.

The connection position of the first power supply stack via 3A to the first upper-layer power supply wire 12A is a position between the first lower-layer power supply wire 11A and the second lower-layer power supply wire 11B. Similarly, the connection position of the second power supply stack via 3B to the second upper-layer power supply wire 12B is a position between the first lower-layer power supply wire 11A and the second lower-layer power supply wire 11B in the plane view. Accordingly, the intermediate wire 29A and the intermediate wire 29B can be placed and arranged in the same line along the X direction in the plane view.

The connection position of the first power supply stack via 3A to the first lower-layer power supply wire 11A is a position overlapping with the first lower-layer power supply wire 11A in the plane view. The intermediate wires 22A, 24A, 26A are formed so as to be positioned above the first lower-layer power supply wire 11A. Similarly, the connection position of the second power supply stack via 3B to the second lower-layer power supply wire 11B is a position overlapping with the second lower-layer power supply wire 11B in the plane view. The intermediate wires 22B, 24B, 26B are formed so as to be positioned above the second lower-layer power supply wire 11B.

The intermediate wires 22A, 24A, 26A and the intermediate wires 22B, 24B, 26B are placed and arranged in the same line in the Y direction in the plane view.

Therefore, the connection position of the first power supply stack via 3A to the first upper-layer power supply wire 12A and the connection position of the first power supply stack via 3A to the first lower-layer power supply wire 11A are shifted in the X direction and the Y direction in the plane view.

Thus, the shift of the connection position in the Y direction is adjusted by the intermediate wires 27A, 27B as connection wires. Also, the shift of the connection position in the X direction is adjusted by shifting the position of the via 30A provided on the upper side of the intermediate wire 29A and the via 28A provided on the lower side in the X direction and shifting the position of the via 30B provided on the upper side of the intermediate wire 29B and the via 28B provided on the lower side in the X direction.

In the wiring layers M1 to M6 provided on the interlayer dielectrics 31 to 35, the priority wiring direction when a signal line or the like is wired is generally defined. For example, as shown in FIG. 2A, the direction along the Y direction becomes the priority wiring direction in the wiring layer M4 provided on the interlayer dielectric 33. Then, a wiring track 50 is defined at fixed intervals along the priority wiring direction. The signal line or the like is wired on the wiring track 50 in the circuit design of a semiconductor integrated circuit. Like the wiring layer M4, the direction along the Y direction becomes the priority wiring direction in the wiring layers M2, M6.

As shown in FIG. 3A, the direction along the X direction becomes the priority wiring direction in the wiring layer M5 provided on the interlayer dielectric 34. Then, a wiring track 51 is defined at fixed intervals along the priority wiring direction. Like the wiring layer M5, the direction along the X direction becomes the priority wiring direction in the wiring layers M1, M3. The lower-layer power supply wires 11A, 11B and the upper-layer power supply wires 12A, 12B are also formed to extend along the respective priority wiring directions.

In a semiconductor integrated circuit according to the first embodiment, as shown in FIG. 2A, intermediate wires (for example, the intermediate wire 26A and the intermediate wire 26B) formed in the same wiring layer are placed along the same line in the Y direction and the intermediate wires 27A, 27B as position converting wires are also provided in a region created by elongating the intermediate wires 26A, 26B in the Y direction and thus, the number of wiring tracks hindered by such intermediate wires can be limited. In FIG. 2A, wiring tracks hindered by intermediate wires are indicated by a broken line and wiring tracks not hindered by intermediate wires are indicated by a solid line (this also applies to FIGS. 3A and 4 to 7).

Figure 10:
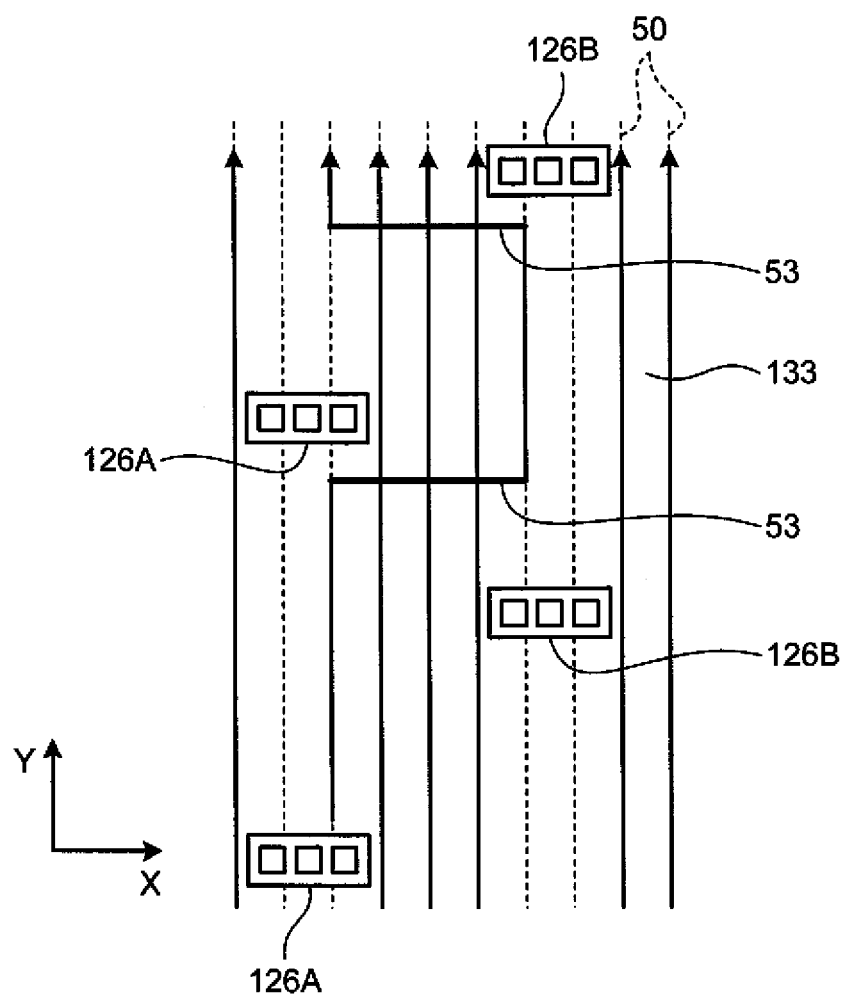
FIG. 10 is a plan view showing the intermediate wiring layer of the semiconductor integrated circuit as Comparative Example.

FIG. 10 is a plan view showing the intermediate wiring layer of the semiconductor integrated circuit as Comparative Example. In FIG. 10, intermediate wires 126A, 126B provided on an interlayer dielectric 133 are not placed in the same line along the Y direction and are arranged by being mutually shifted in the X direction.

Assume here that the number of intermediate wires of the same size is the same for wiring layers of the same track wires for the case of FIG. 2A and the case of FIG. 10. Then, four track wires are hindered by intermediate wires due to a set of power supply stack vias in the semiconductor integrated circuit according to Comparative Example. In the semiconductor integrated circuit according to the first embodiment, on the other hand, two track wires are hindered by intermediate wires due to a set of power supply stack vias. Therefore, compared with Comparative Example, the number of track wires hindered by intermediate wires can be reduced in the first embodiment.

When a signal line is formed on a track wire hindered by intermediate wires, it is necessary for the signal line to make a detour to another wiring layer having a different priority wiring direction to cross intermediate wires. A bypass wire 53 shown in FIG. 10 is a signal line that makes a detour through an upper-layer or lower-layer wiring layer of the interlayer dielectric 133. Thus, by providing the bypass wire 53, performance of a semiconductor integrated circuit may be degraded due to a longer wiring length or congestion of signal wiring.

In a semiconductor integrated circuit according to the first embodiment, as described above, the number of track wires hindered by intermediate wires can be reduced and thus, the wiring length can be suppressed from being elongated by reducing bypass wires. Accordingly, signal wiring is simplified and also performance degradation of a semiconductor integrated circuit can be limited.

In a semiconductor integrated circuit according to the first embodiment, as shown in FIG. 3A, intermediate wires (for example, the intermediate wire 29A and the intermediate wire 29B) formed in the same wiring layer are placed along the same line in the Y direction and thus, the number of wiring tracks hindered by these intermediate wires can be limited.

Figure 11:
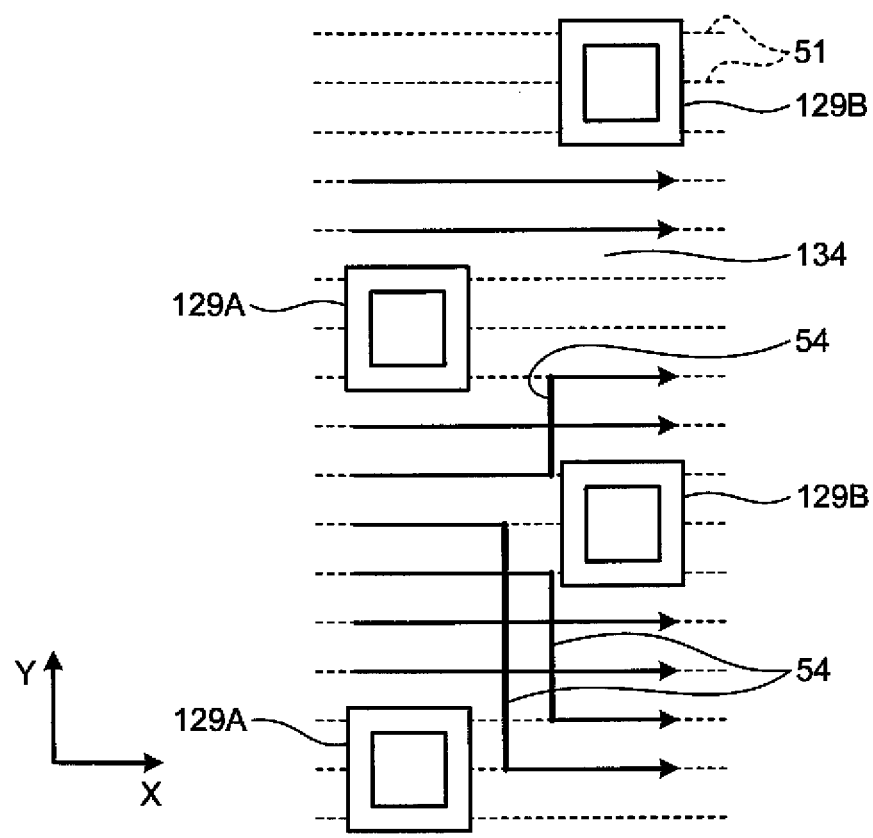
FIG. 11 is a plan view showing the intermediate wiring layer of the semiconductor integrated circuit as Comparative Example.

FIG. 11 is a plan view showing the intermediate wiring layer of the semiconductor integrated circuit as Comparative Example. In FIG. 11, intermediate wires 129A, 129B provided on an interlayer dielectric 134 are not placed in the same line along the X direction and are arranged by being mutually shifted in the Y direction.

Assume here that the number of intermediate wires of the same size is the same for wiring layers of the same track wires for the case of FIG. 3A and the case of FIG. 11. Then, six track wires are hindered by intermediate wires due to a set of power supply stack vias according to Comparative Example. In the semiconductor integrated circuit according to the first embodiment, on the other hand, two track wires are hindered by intermediate wires due to a set of power supply stack vias. Therefore, compared with Comparative Example, the number of track wires hindered by intermediate wires can be reduced in the first embodiment.

When a signal line is formed on a track wire hindered by intermediate wires, as described above, it is necessary for the signal line to make a detour to another wiring layer having a different priority wiring direction to cross intermediate wires. A bypass wire 54 shown in FIG. 11 is a signal line that makes a detour through an upper-layer or lower-layer wiring layer of the interlayer dielectric 134. Thus, by providing the bypass wire 54, performance of a semiconductor integrated circuit may be degraded due to a longer wiring length or congestion of signal wiring.

In a semiconductor integrated circuit according to the first embodiment, the number of track wires hindered by intermediate wires can be reduced and thus, the wiring length can be suppressed from being elongated by reducing bypass wires. Accordingly, signal wiring is simplified and also performance degradation of a semiconductor integrated circuit can be limited.

In lower layers of the intermediate wire 29A and the intermediate wire 29B, the intermediate wire 27A and the intermediate wire 27B are also placed and arranged in the same line along the Y direction. Thus, similar to the above case, the number of track wires hindered by intermediate wires can be reduced and therefore, the wiring length can be suppressed from being elongated by reducing bypass wires. Accordingly, signal wiring is simplified and also performance degradation of a semiconductor integrated circuit can be limited.

Figure 8:
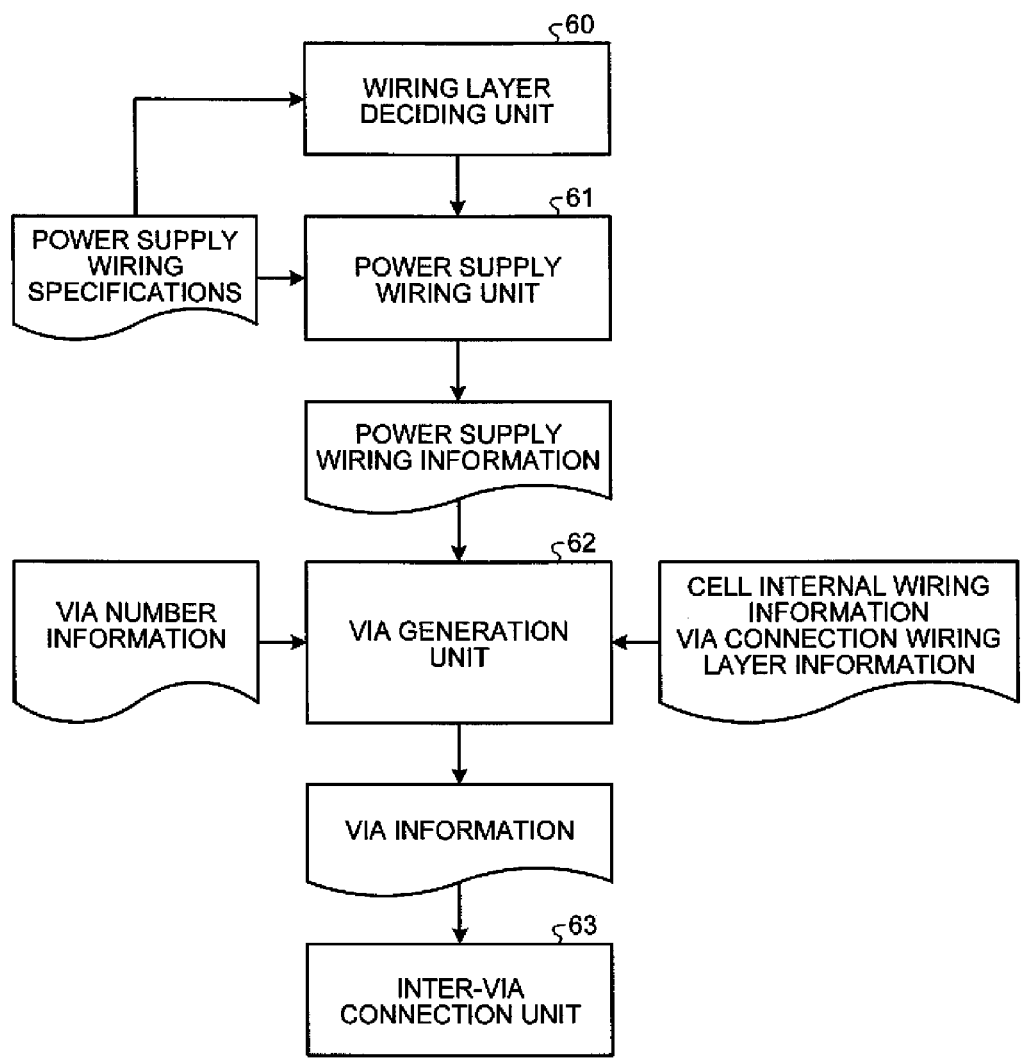
FIG. 8 is a block diagram showing an outline configuration of a design apparatus of the semiconductor integrated circuit according to the first embodiment.

Next, the design apparatus of a semiconductor integrated circuit will be described. FIG. 8 is a block diagram showing an outline configuration of a design apparatus of a semiconductor integrated circuit according to the first embodiment. The design apparatus of a semiconductor integrated circuit includes a wiring layer deciding unit 60, a power supply wiring unit 61, a via generation unit 62, and an inter-via connection unit 63.

The wiring layer deciding unit 60 decides the via connection wiring layer from the wiring layers M2 to M5. The power supply wiring unit 61 receives power supply wiring specifications such as the net name, wiring width, and wiring interval as input to generate power supply wiring (the lower-layer power supply wires 11A, 11B and the upper-layer power supply wires 12A, 12B).

The via generation unit 62 receives information of power supply wiring laid by the power supply wiring unit 61 as input to generate vias by calculating the number of vias and via positions. The number of vias may automatically be calculated from the information of power supply wiring or may be decided based on information input from outside. Information about which via to arrange in which position may be decided based on information inputted from outside or may be automatically calculated.

If each via generated by the via generation unit 62 is not connected by an overhang needed for the via under design rules, the inter-via connection unit 63 generates a needed wire for connection of each via.

Figure 9:
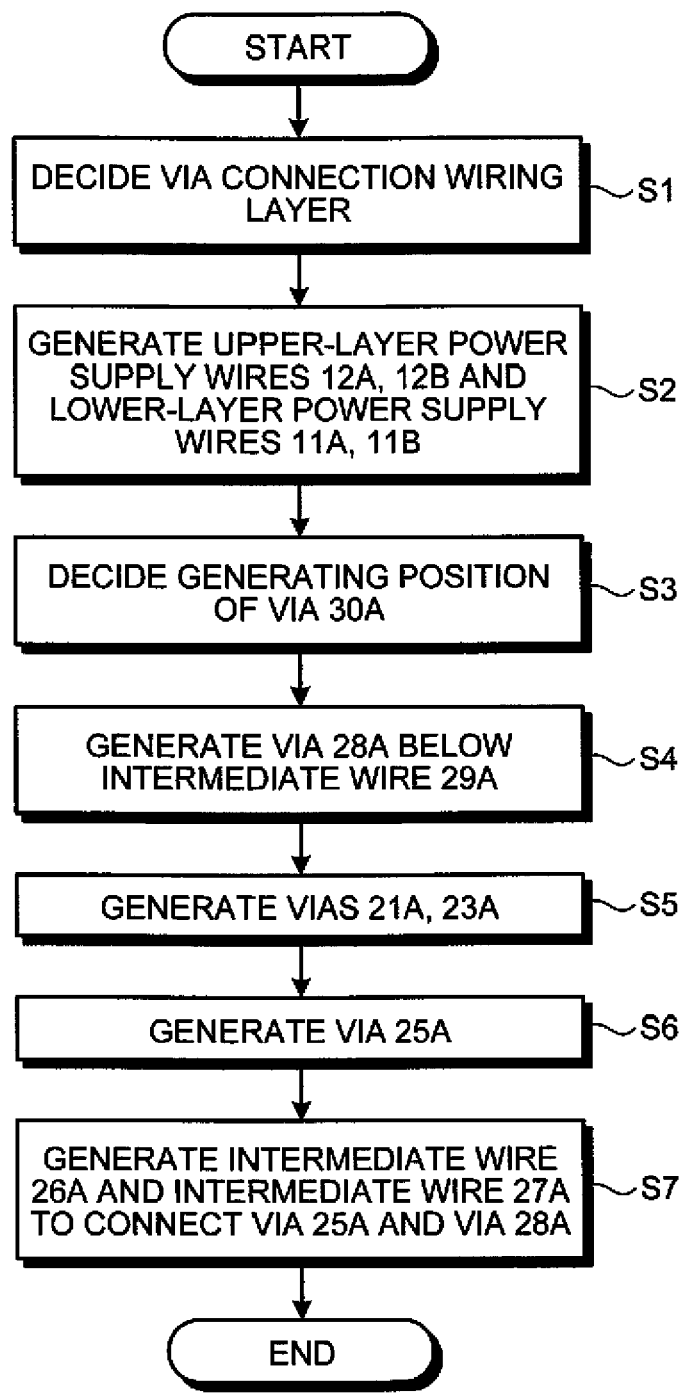
FIG. 9 is a flow chart showing a design procedure of the semiconductor integrated circuit.

Next, the design procedure by the design apparatus of a semiconductor integrated circuit will be described. FIG. 9 is a flow chart showing the design procedure of a semiconductor integrated circuit. In the description that follows, power supply wires are assumed to include two types of wires, VDD wires and VSS wires, but a semiconductor integrated circuit can still be designed even if there are three types or more.

A semiconductor integrated circuit having six layers of M1 to M6 as wiring layers will be designed and a procedure for designing a semiconductor integrated circuit that can be wired by avoiding a detour of signal lines as much as possible, that is, a semiconductor integrated circuit shown in FIG. 1 will be shown. The priority wiring direction of each wiring layer is as described above, the direction along the X direction for the wiring layers M1, M3, M5 and the direction along the Y direction for the wiring layers M2, M4, M6.

First, the via connection wiring layer is decided (step S1). The via connection wiring layer becomes an intermediate wiring layer having the wiring direction of the upper-layer power supply wires 12A, 12B as the priority wiring direction. The upper-layer power supply wires 12A, 12B are formed in the wiring layer M6 and thus, the wiring layer M4 or the wiring layer M2 becomes the via connection wiring layer. If, for example, the wiring layer M2 is used as a cell internal wire, the cell internal wire and a power supply stack via interfere and no cell may be arrangeable under power supply wiring. For the decision of the via connection wiring layer, cell internal wiring information may be used for the decision or the wiring layer specified by external input may be decided as the via connection wiring layer. In the first embodiment, it is assumed that the wiring layer M2 is used for cell internal wiring and the wiring layer M4 is selected as the via connection wiring layer.

Next, the upper-layer power supply wires 12A, 12B and the lower-layer power supply wires 11A, 11B are generated according to the power supply wiring specifications (step S2). This processing only needs to be performed before via generation processing.

Next, the generating position of the via 30A is decided (step S3) and via 30A is generated in the position. For example, as shown in FIG. 6, the position after being moved to the intermediate position between the first lower-layer power supply wire 11A and the second lower-layer power supply wire 11B in the plane view from the intersection of the first lower-layer power supply wire 11A and the first upper-layer power supply wire 12A is decided as the generating position. The generating position of the via 30A may also be decided by moving from the position shown in FIG. 6 to the side of the first lower-layer power supply wire 11A and then moving to a position that minimizes the number of wiring tracks hindered by the intermediate wire 29A in the wiring layer M5 (see FIG. 7).

Next, the via 28A is generated below the intermediate wire 29A (step S4). If a plurality of the vias 28A is needed, the vias 28A are placed and arranged along the Y direction, which is the priority wiring direction of the wiring layer M4.

Next, the vias 21A, 23A are generated (step S5). The vias 21A, 23A are arranged in a position overlapping with the first lower-layer power supply wire 11A in the plane view and an intermediate position between the first upper-layer power supply wire 12A and the second upper-layer power supply wire 12B to avoid interference with cell internal wires including the intermediate wire 22A (see FIG. 4). The generating positions of the vias 21A, 23A may also be decided by moving from the position shown in FIG. 4 to the side of the first upper-layer power supply wire 12A and then moving to positions that minimize the number of wiring tracks hindered by the intermediate wire 22A in the wiring layer M2 (see FIG. 5).

Next, the via 25A is generated (step S6). The wiring layer M4 is decided as the via connection wiring layer and thus, the via 25A is generated in a position overlapping with the vias 21A, 23A in the plane view. Next, the via 25A and the via 28A are not connected in the wiring layer M4 and thus, the intermediate wire 26A and the intermediate wire 27A are generated to connect the via 25A and the via 28A (step S7) to generate the first power supply stack via 3A.

The vias 21B, 23B, 25B, 28B, 30B and the intermediate wires 22B, 24B, 26B, 27B, 29B are generated at the same time as steps S1 to S7 to generate the second power supply stack via 3B. By arranging the vias and intermediate wires on the side of the first power supply stack via 3A and the vias and intermediate wires on the side of the second power supply stack via 3B in each step in such a way that the spatial relationship as described in the configuration of the above semiconductor integrated circuit is achieved, signal wiring is simplified and also performance degradation of the semiconductor integrated circuit can be limited.

Figure 12:
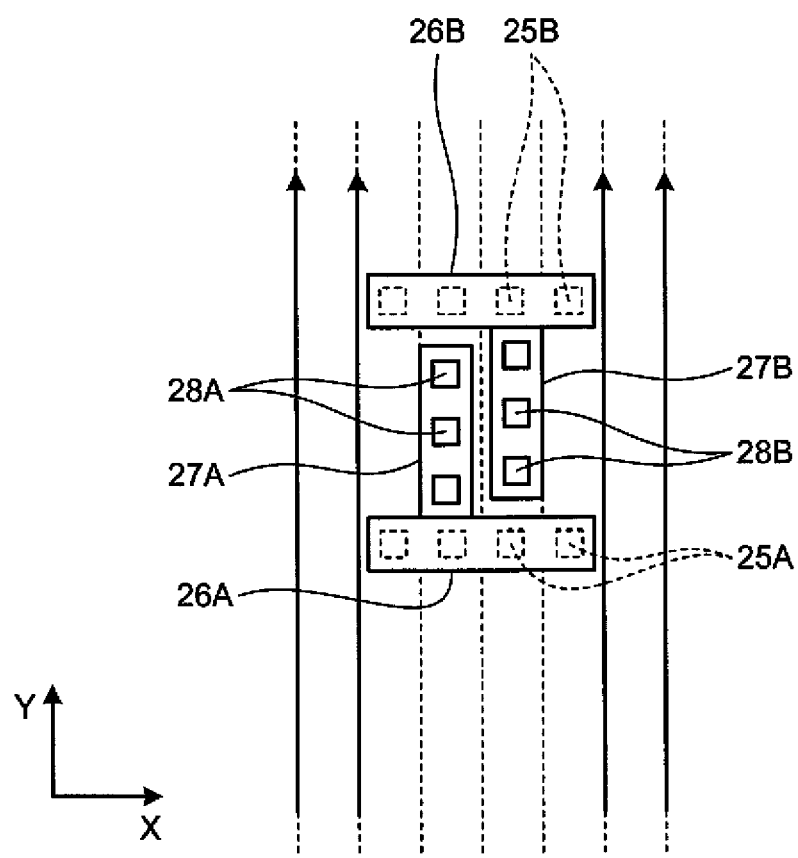
FIG. 12 is a plan view of a first intermediate wire of the semiconductor integrated circuit according to a modification of the first embodiment.

FIG. 12 is a plan view of a first intermediate wire of the semiconductor integrated circuit according to a modification of the first embodiment. If, as shown in FIG. 12, the number of vias provided below the intermediate wires 26A, 26B is four or more, as shown in FIG. 12, the shape combining the intermediate wire 26A and the intermediate wire 27A and the shape combining the intermediate wire 26B and the intermediate wire 27B may exhibit a T shape. Even in this case, the intermediate wires 27A, 27B as connection wires are formed in a region created by elongating the intermediate wires 26A, 26B in the Y direction. Thus, the number of wiring tracks hindered by these intermediate wires can be limited.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the sprit of the inventions. The accompanying claims and their equivalents are intended to cover such forms or modifications as would fall within the scope and spirit of the inventions.

What is claimed is:

1. A power supply wiring structure, comprising:
a first lower-layer power supply wire and a second lower-layer power supply wire extended in a first direction in a lower wiring layer;
a first upper-layer power supply wire and a second upper-layer power supply wire extended in a second direction substantially perpendicular to the first direction in a plane view in an upper wiring layer;
a first connection portion connecting the first upper-layer power supply wire and the first lower-layer power supply wire; and a second connection portion connecting the second upper-layer power supply wire and the second lower-layer power supply wire, wherein the first connection portion includes:

a first connection wire formed in a predetermined wiring layer between the lower wiring layer and the upper wiring layer and positioned above the first lower-layer power supply wire, a first lower-side via that is provided below the first connection wire, and connects the first connection wire and the first lower-layer power supply wire, a first position converting wire connected to the first connection wire and extending along the second direction, and a first upper-side via that is provided above the first position converting wire, and connects the first position converting wire and the first upper-layer power supply wire, the second connection portion includes:

a second connection wire formed in the predetermined wiring layer and positioned above the second lower-layer power supply wire, a second lower-side via that is provided below the second connection wire, and connects the second connection wire and the second lower-layer power supply wire, a second position converting wire connected to the second connection wire, extending along the second direction, and provided closer to the second upper-layer power supply wire than the first connection wire in the plane view, and a second upper-side via that is provided above the second position converting wire, and connects the second position converting wire and the second upper-layer power supply wire, the first upper-side via and the second upper-side via are arranged in a same line along the first direction.

2. The power supply wiring structure according to claim 1, wherein the first upper-side via and the second upper-side via are arranged in the position between the first lower-layer power supply wire and the second lower-layer power supply wire in the plane view.

3. The power supply wiring structure according to claim 1, wherein an overall shape combining the first connection wire and the first position converting wire in the plane view and the overall shape combining the second connection wire and the second position converting wire in the plane view exhibit an L shape.

4. The power supply wiring structure according to claim 1, wherein an overall shape combining the first connection wire and the first position converting wire in the plane view and the overall shape combining the second connection wire and the second position converting wire in the plane view exhibit a T shape.

5. The power supply wiring structure according to claim 1, wherein the first lower-layer power supply wire and the first upper-layer power supply wire are VDD wires used to supply a power supply potential.

6. The power supply wiring structure according to claim 1, wherein the second lower-layer power supply wire and the second upper-layer power supply wire are VSS wires used to supply an earth potential.

7. The power supply wiring structure according to claim 1, further comprising: interlayer dielectrics provided between the predetermined wiring layer and the first and second lower-layer power supply wires, wherein a plurality of the first and second lower-side vias is provided so as to cut through the interlayer dielectrics.

\* \* \* \* \*